United States Patent [19]

Lemonier et al.

[11] Patent Number: 4,687,922
[45] Date of Patent: Aug. 18, 1987

[54] IMAGE DETECTOR OPERABLE IN DAY OR NIGHT MODES

[75] Inventors: Michel G. Lemonier; Maurice L. J. Petit, both of Paris, France

[73] Assignee: U.S. Philips Corporation, New York, N.Y.

[21] Appl. No.: 797,060

[22] Filed: Nov. 12, 1985

[30] Foreign Application Priority Data

Nov. 30, 1984 [FR] France .................. 84 18285

[51] Int. Cl.⁴ ............... H01J 31/08; H01J 40/06; H01J 40/16; H01L 25/00
[52] U.S. Cl. ..................... 250/213 VT; 250/332; 313/544
[58] Field of Search ........... 250/213 R, 213 VT, 332, 250/370 G; 313/524, 542, 544

[56] References Cited

U.S. PATENT DOCUMENTS 3,735,139  5/1973  Kalitinsky et al. ........... 250/553 X
4,178,528 12/1979  Kennedy ...................... 313/544
4,178,529 12/1979  Kennedy ...................... 313/544

Primary Examiner—Eugene R. LaRoche
Assistant Examiner—David Mis
Attorney, Agent, or Firm—Marc D. Schechter

[57] ABSTRACT

The invention relates to an image detector for a camera operating in a "day" mode and a "night" mode. The detector comprises an evacuated envelope containing a semitransparent photocathode for the transmission of incident photons or for converting photons into photoelectrons, depending on whether the mode is "day" or "night", respectively. The detector also comprises a detector capable of converting the incident photons or the photoelectrons into an electrical image signal. The image detector further includes electronic means for focussing the photoelectrons onto the detector, and optical means for focussing the photons onto the photocathode or onto the detector. The photocathode comprises a thin layer having at least one active layer of a III–V n-type material. The detector consists of a two-dimensional charge transfer device. The electronic means for focussing the photoelectrons on the charge transfer device comprises proximity focussing means.

6 Claims, 2 Drawing Figures

IMAGE DETECTOR OPERABLE IN DAY OR NIGHT MODES

BACKGROUND OF THE INVENTION

The invention relates to an image detector for a camera operating in two modes: a "day" mode and a "night" mode. The camera consists of an evacuated envelope containing:

(a) on an inlet window, a semitransparent photocathode for the transmission of incident photons or for converting photons into photoelectrons, depending on whether the mode is "day" or "night", respectively, (b) on an outlet support, a detector capable of converting the incident photons or the photoelectrons into an electrical image signal, depending on whether the mode is "day" or "night", respectively, and (c) electronic means for focussing the photoelectrons on the detector, and optical means for focussing the photons on the photocathode in the "night" mode, and optical means for focusing the photons on the detector in the "day" mode.

A device of this type is already described in U.S. Pat. No. 3,735,139. This patent describes a photodetector system with dual mode capability of operating in "bright light" and "dim light".

In this device, a tubular shaped vacuum envelope contains at one end a photocathode capable of being semitransparent and at the other end a detector comprising a linear array of photodiodes. Inside the envelope is arranged an electron gun structure comprising a certain number of electrodes to which high voltages, uniformly distributed with the aid of resistance bridges, are applied. Deflection coils and focussing coils are arranged outside the envelope to act on the emitted photoelectrons and deflect them and focus them on the detector.

Also outside the envelope, but in this case to process the luminous flux, are several lenses which enable an image to be focussed directly on the detector when the light is bright or on the photocathode when the light is dim. It is necessary then to intervene in respect of the number and/or position of these lenses so as to ensure the double mode operation. The detector is both sensitive to the direct radiation of photons and the flux of photoelectrons emitted by the photocathode in response to the radiation of photons.

However, this system has several disadvantages. First of all, the electronic focussing means which rely on a proven technique are bulky, are delicate and tedious to implement, and require a stack of high-voltage electrodes.

In addition, electronic scanning means are needed due to the fact that the focussed electron flux must be moved onto the entire useful surface of the detector so as to create a two-dimensional image. Because of this, the exposure time or "integration time" of each point of the image is limited to the duration of one line.

Furthermore, the optical focussing means have disadvantages due, in particular, to the fact that it is necessary to modify the number and arrangement of the lenses depending on the selected mode so that the photon radiation can be focussed either on the photocathode or on the detector and to a great depth.

SUMMARY OF THE INVENTION

It is an object of the present invention, therefore, to eliminate the disadvantages just outlined particularly by giving the image detector great compactness by means of a modified design.

To achieve this, the invention has the following features:

the semitransparent photocathode comprises a thin sheet having at least one active layer of a binary or pseudobinary III–V material, the detector consists of a bidimensional charge transfer device, and the electronic means for focussing the photoelectrons on the charge transfer device consist of proximity focussing means.

The semitransparent photocathode is placed inside the vacuum envelope constituting the image detector. The inlet window is made of a radiation-transparent substrate of glass or monocrystalline oxide such as sapphire on which the semitransparent photocathode is deposited.

The photocathode comprises an active layer consisting of a binary or pseudo-binary III–V material such as gallium arsenide GaAs. The method of manufacturing the inlet window with the semitransparent photocathode is the same, in its various stages, as the method used for a nontransparent photocathode.

The method consists in growing, typically by liquid phase epitaxy, on a provisional substrate of a III–V compound such as gallium arsenide GaAs, a so-called chemical barrier layer of $Ga_{1-x}Al_x$ As which acts as a barrier to the action of the etching solution. The etching solution is then used to remove the provisional substrate. A barrier layer having a thickness on the order of 0.5 to 5 $\mu$m has produced satisfactory results.

A so-called active layer, generally of gallium arsenide very highly doped with up to $10^{19}$ atoms/cm$^3$, of germanium (Ge) or zinc (Zn) for example, is then grown. An active layer having a thickness on the order of 0.5 $\mu$m is suitable for application as a semitransparent photocathode.

Finally, a passivating layer is formed in order to prevent the diffusion of unwanted substances into the active layer during the later sealing stages, and to reduce the recombination of the charge carriers at the interface. A passivating layer of $Ga_{1-y}Al_y$As with a thickness on the order of 5 $\mu$m is satisfactory for this purpose.

This semiconducting heterostructure equipped with a $SiO_2$ protective layer and a $Si_3N_4$ index adaptation layer is then bonded to a support which is transparent to photons and is usually made of borosilicate glass. The bond is accomplished by thermocompression by raising the temperature just above the softening temperature of the glass. Once the bond has been made, the provisional substrate and the barrier layer are etched away by means of two different etching solutions.

In the example described, the provisional GaAs substrate is etched by a mixture of ammonia and oxygenated water. The barrier layer which is insensitive to the first etching solution is removed by hydrofluoric acid after protection of the vitreous support.

The product obtained then comprises a vitreous support serving as an inlet window, a $Si_3N_4$ index adaptation window, a $SiO_2$ protective layer, a passivating layer and a very high quality active layer. The $Si_3N_4$ index adaptation layer, the $SiO_2$ protective layer and the passivating layer may, where necessary, be modified in number and nature depending on the application.

Finally, before this semiconductor/vitreous support structure is used as a photocathode, vacuum desorption of the surface of the GaAs active layer is effected by heating to a temperature close to the point of congruent evaporation of the compound. For GaAs, this temperature is close to 630° C.

The active layer is then coated with a cesium oxygen layer during a vacuum cesium-formation process at ambient temperature, so as to impart maximum photoelectric sensitivity to the active GaAs layer.

For resistance to the stresses which may occur in the active GaAs layer, it is possible to use a vitreous support comprising a stack of several glass sheets with suitable thermoelastic and thermoviscous properties, as known in the art.

The gallium arsenide photocathode thus obtained has only very minor surface irregularities. This means that proximity focussing can be used to focus the photoelectrons.

According to the invention, the thickness of the active GaAs layer is typically 0.5 $\mu$m. This thickness represents a compromise necessitated by the purpose of the invention which, depending on the operating mode, is to have a photocathode which absorbs the photons in the "night" mode but which transmits the photons in the "day" mode. The semitransparent of the photocathode depends, of course, on the wavelength of the incident light. The light spectrum which is of primary concern in the invention extends from approximately 0.5 $\mu$m to 0.9 $\mu$m. In this range it is the active GaAs layer which governs the absorption and tranmission mechanisms of photons.

The values of the transmission for this range of wavelengths are indicated in Table 1:

TABLE 1

| Wavelengths in $\mu$m | 0.5 | 0.6 | 0.7 | 0.8 | 0.9 | 1 |
|---|---|---|---|---|---|---|
| Transmission in % | 5 | 8 | 18 | 40 | 68 | 70 |

The relationships of these wavelengths the sensitivity of the charge transfer device (described below) is indicated in Table 2:

TABLE 2

| Wavelengths in $\mu$m | 0.5 | 0.6 | 0.7 | 0.8 | 0.9 | 1.0 |
|---|---|---|---|---|---|---|
| Sensitivity (quantitative efficiency %) | 50 | 65 | 75 | 70 | 50 | 25 |

These values show that the transmission of the GaAs photocathode increases with the wavelength (in the range indicated) and that the maximum transmission values and the maximum sensitivity of the charge transfer device are located more or less at the same wavelengths.

The charge transfer device is a shift register for analog signals. In its simplest form it comprises a monocrystalline semiconductor substrate on which different electrodes, insulated from the substrate by oxide layers, are placed.

The substrate is generally silicon and the insulator is silicon oxide. The charge transfer device stores the samples of the signal in the form of packets of charge, then transfers them in parallel to a charge amplifier, while keeping the packets of charge isolated from one another.

Depending on the technologies used, this requires two, three or four consecutive electrodes to form a memory element. To carry out the transfers, periodic clock signals (which are phase-shifted by a half, a third or a quarter clock period according to the number of electrodes forming each memory element) are applied to the electrodes. This creates sources of potential which are translated progressively to the entire line comprising an array of memory elements. The charges which are generated during the pickup of the image are thus translated by the movement of these sources of potential to the charge output amplifier.

Charge transfer devices intended for imaging fulfill a dual function: that of detection of the image, and that of transfer of the charges produced. These devices can be organized with a sensitive zone and a memory zone, the latter comprising an assembly of rows and columns. Their structure is then the so-called "frame transfer" structure known in the art. This structure is eminently suitable for detection by the back surface of the charge transfer device.

According to the invention, the two-dimensional charge transfer device (CTD) is utilized by exploiting the property that it has for being sensitive at one and the same time to photons and photoelectrons for carrier injection. For this purpose it is necessary to adapt the CTD for this application.

In fact, in the form in which it is normally implemented, the CTD has, at its surface, protective layers, mainly of oxides, and contacts and connections which are detrimental to the creation of the charges by the photoelectrons in the sources of potential situated below the electrodes. It is necessary, therefore, to create the charges at the back of the CTD.

To do this, the first thing is to reduce, under the sensitive area, the thickness of the silicon substrate, initially on the order of 400 $\mu$m, on which the electronic structure forming the CTD is deposited. Furthermore, the back surface of the thinned CTD must have an accumulation of majority carriers so as to lower the surface recombination rate.

For this purpose, the CTD is formed on an epitaxial material comprising a p++ substrate heavily doped with boron ($10^{19}$ atoms/cm$^3$). A P epitaxial layer of 8 to 12 $\mu$m thickness and weakly doped with boron ($5.10^{14}$ atoms/cm$^3$) is deposited on the P++ substrate. The circuit is produced on the P epitaxial layer. The thickness of the P++ substrate is reduced in two passes by chemical polishing, at ambient temperature, on the sensitive zone.

First of all, a rapid, isotropic preliminary etching is used to remove the major part of the substrate (i.e. approx. 380 $\mu$m). This is done with the aid of a solution of nitric acid, acetic acid and hydrofluoric acid in the proportions 5:3:3. The regularity of the etch is very sensitive to the agitation conditions of the bath and the specimen. Rotating the substrate at 200 r.p.m. leads a final thickness with good consistency. This etching is stopped as soon as the specimen appears purple when examined under transmission; this corresponds to a residual thickness of approximately 20 $\mu$m.

Then, a slow etch is carried out with the purpose of leaving nothing but an overdoped layer of 0.5 $\mu$m to 1 $\mu$m thickness. The etch is made with the aid of a solution of nitric acid, acetic acid and hydrofluoric acid in the proportions 3:8:1, in the presence of hydrogen peroxide in the ratio of 5 ml per 350 ml of acid solution. The etching is stopped for dopings of less than $10^{17}$ atoms/cm$^3$. This slow etch ensures good uniformity of thickness and, at the same time, preserves an overdoped P+ layer on the back surface thereby achieving the desiree accumulation conditions.

The charge transfer device is bonded to the periphery of the substrate before the etching operations. This charge transfer device is bonded with the aid of metal pads placed between the contacts of the charge transfer device and a sapphire or glass mounting support on which the conducting tracks are placed either by silk screening or by etching. The periphery of the specimen and the substrate are protected during the chemical etching by a wax mask applied by brush.

The thickness of the sensitive zone of the charge transfer device is thus reduced from approximately 400 μm to approximately 10 μm. This enables the photons and photoelectrons to be absorbed at a distance sufficiently close to the sources of potential to allow the charges created to get there without bulk or surface recombination nor lateral diffusion. The charges thus stored in the two-dimensional structure are read line-by-line while being transferred to an output shift register. The readout of the shift register supplies an electrical signal. This signal can then be displayed by conventional devices, for example a television set.

A fundamental characteristic of the invention is the fact that the semitransparent photocathode and the charge transfer device are arranged in such a way that the photoelectrons coming from the photocathode are proximity-focussed on the charge transfer device. This focussing is characterized by a very small distance between the two opposing elements. For the image detector embodying the invention, this distance is, typically, on the order of 2 mm which rules out the use of any intermediate accelerating and focussing electrode. The electronic image originating from the cathode is thus reproduced on the detector, and the distortions and aberrations are small enough not to have a detrimental effect on the quality of the image.

The photocathode and the charge transfer device are connected to the terminals of a high voltage generator, typically of 10 kvolt according to the invention (i.e. an electric field of 5 kvolt/mm).

If G is used to designate the electronic gain of the CTD such that the incident charge is multiplied by G to obtain the signal charge created at any point on the CTD, then we have:

$$G = \frac{q(V - V_0)}{E_i}$$

where V is the potential difference between the photocathode and the CTD;

$E_i = 3.6$ electron-volts (i.e. the mean energy required to create an electron-hole pair in silicon bombarded by electrons of several kiloelectron-volts);

$V_o$ is a technological parameter which takes into account the surface recombination effects on the bombarded back surface. In practice, $V_o = 3$ kV; and $q = 1.6 \times 10^{-19}$ Cb.

In the case of the values just quoted the gain G is found to be approximately 2000.

To define the performance of the image detector, it is necessary to refer to a standard light source illuminating the photocathode. Such a source is formed by an emitting black body at a temperature of 2854 K. By integrating with respect to the useful wavelength spectrum for the image pickup, which is located approximately in the band 0.5 μm, −1 μm, we obtain a mean transmission of 30% for the semitransparent photocathode. With due regard for the electronic gain G=2000 this makes it possible to detect some photoelectrons per pixel and per frame.

When utilized in the "night" mode, it is possible to operate therefore with illuminations going down as low as approximately $10^{-4}$ lux. The range of illumination on the photocathode extends therefore from approximately 1000 lux in the "day" mode to approximately $10^{-4}$ in the "night" mode. In the "day" mode the semitransparent photocathode introduces a loss of only 30% on average compared with a CTD used on its own.

The operating principle of the image detector intended for use in a camera having "day" and "night" modes is as follows. The camera has an optical device which enables a scene to be focussed either on the semitransparent photocathode or on the back surface of the charge transfer device.

In the "day" mode, because the intensity of the illumination is sufficient, the optical device focusses the image onto the charge transfer device. Being sensitive to the radiation, the latter converts the optical image into an electrical signal which is processed by conventional electronic means. No high voltage is applied therefore between the photocathode and the charge transfer device, and no photoelectrons reach the latter.

In the "night" mode, because the illumination is low, the optical device focusses the image on the photocathode. A potential difference, of 10 kvolt for example, is applied between the photocathode and the charge transfer device by a switchable voltage supply 32. The photoelectrons which are emitted by the photocathode under the action of the photon radiation are accelerated and create electron-hole pairs in the charge transfer device. The electron-hole pairs generate an electrical signal which is used by the same conventional electronic means as before.

The short distance and the strong electric field between the photocathode and the charge transfer device as well as the monocrystalline structure and the III-V material used mean that the mean lateral component of the initial energy of the photoelectrons is low. This ensures a good definition of the final reconstituted image. This definition is on the order of 30 pairs of lines per millimeter.

The image detector has been described with a gallium arsenide photocathode. It is also possible, of course, to use other binary or ternary or quaternary materials for the photocathode, in as much as the surface state of the active layer enables proximity focussing to be used. These layers can be produced not only by liquid phase epitaxy but also by vapor phase epitaxy of organometallic compounds.

DESCRIPTION OF THE PREFERRED EMBODIMENTS

Figure 1:
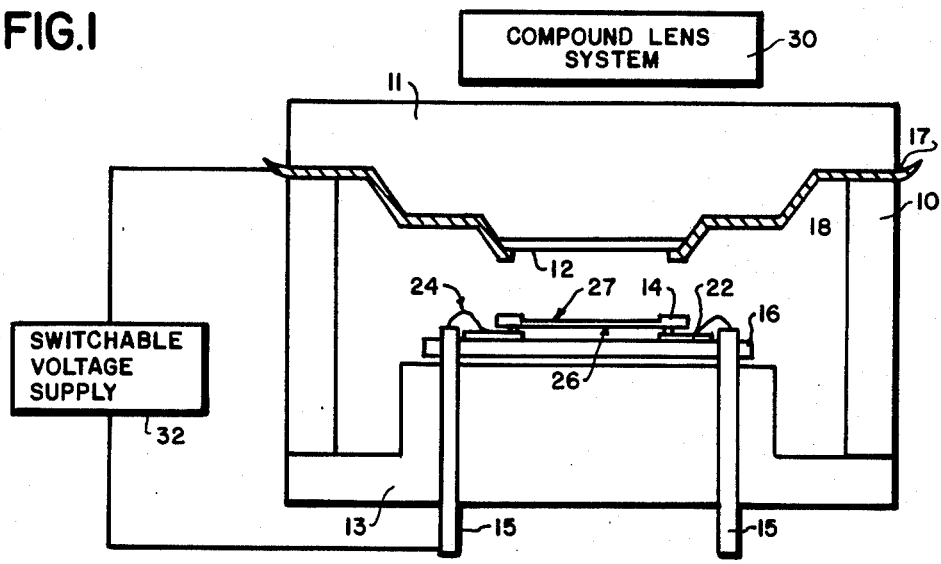
FIG. 1 is a partly schematic, partly cross-sectional view of an image detector according to the invention.

FIG. 1 illustrates an image detector according to the invention. It consists of a vacuum envelope comprising an inlet window 11, a back support 13 and a peripheral sleeve 10. The inlet window 11 also comprises the substrate of a photocathode 12. The back support 13 contains a certain number of vacuum-tight electric current leads 15 of which two are shown in FIG. 1 so as not to clutter up the drawing.

The mounting support 16 which accommodates the thinned charge transfer device 14 is fixed on the back support 13 of the image detector. Support 16 is mounted on the electrical leads 15 intended for the ground connections. The ground connections are fitted with an electrically welded locking washer.

The semitransparent photocathode 12, manufactured according to the method described previously, is arranged opposite the reduced-thickness charge transfer device 14. Photocathode 12 faces the back surface 27 of charge transfer device 14.

Depending on the mode of use, the potential difference can be applied between the electrical lead designated 15 (which is connected to the substrate of the charge transfer device) and the electrical lead (17 connected to the photocathode with the aid of a vapor-deposited nickel chromium metal ring 18.) The optical device (compound lens system 30) projects the image either onto the photocathode 12 or onto the charge transfer device 14.

The charge transfer device has contact pads, made during the production of the device 14 itself, on its front surface and at its periphery. Furthermore, the mounting support 16 (comprising, for example, a sapphire or glass wafer) has a pattern of etched or silk screened conducting tracks 22. The contact pads of the charge transfer device 14 are connected to the pattern of conducting tracks 22 by soldering or an equivalent method. Connecting wires 24 are thermocompression-bonded to the contacts at the periphery of the mounting support 16 and ensure the electrical contact with the electrical leads 15.

Figure 2:
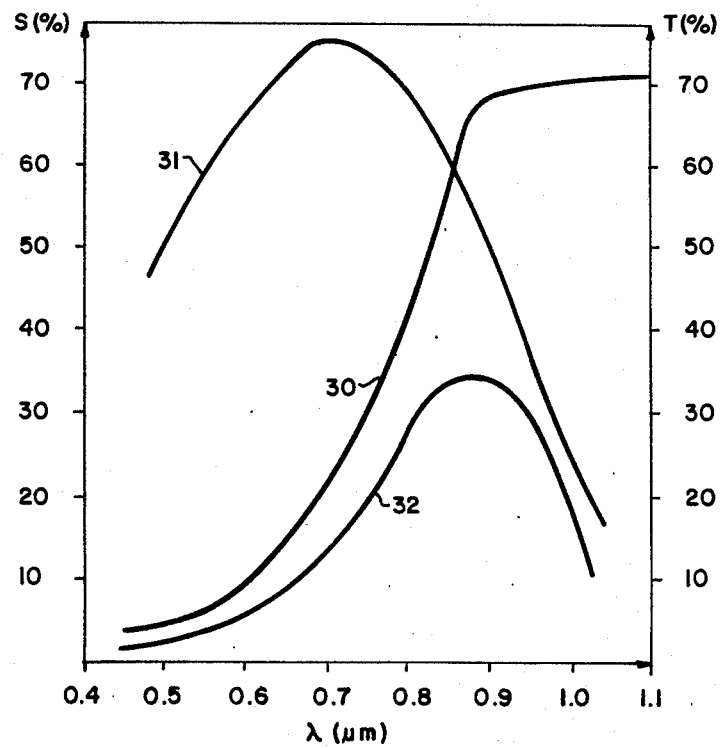
FIG. 2 is a family of curves showing the transmission of the semitransparent photocathode, the sensitivity of the charge transfer device, and the sensitivity of the image detector as a function of the wavelength of the incident radiation.

FIG. 2 shows three curves in the wavelength range from 0.4 $\mu$m to 1.1 $\mu$m.

Curve 30 represents the transmission of a semitransparent GaAs photocathode. With due allowance for the reflection losses which occur at the surfaces of such a photocathode due to variations of refractive indices, it is found that the maximum transmission, equal to 70%, is attained at about 0.9 $\mu$m.

Curve 31 shows the sensitivity of a silicon charge transfer device. The sensitivity is maximum at about 0.7 $\mu$m, and becomes zero at 1.1 $\mu$m.

Curve 32 represents the sensitivity of the image detector embodying the invention. It has its maximum at about 0.85 $\mu$m.

The invention has been described for a photocathode thickness of 0.5 $\mu$m. It is possible, of course, to modify this value, and this has the effect of shifting the wavelength where the maximum sensitivity of the image detector occurs. To remain within the framework of the invention the thickness of the photocathode must be such that sufficient photons reach the detector in the "day" mode, but also that sufficient photoelectrons are created by the photocathode in the "night" mode.

What is claimed is:

1. An image sensor device for day or night operation, said device comprising:
   an evacuated envelope having an inlet window and an outlet support;
   a semitransparent photocathode arranged inside the envelope on the inlet window, said photocathode being capable of transmitting incident photons or converting incident photons into photoelectrons;
   a detector arranged inside the envelope on the outlet support, said detector being capable of converting incident photons received through the photocathode into an electrical image signal or converting incident photoelectrons received from the photocathode into an electrical image signal;
   electronic means for focusing photoelectrons from the photocathode onto the detector, said electronic means being switchable on and off independently of the detector; and
   optical means for focusing photons on either the photocathode or on the detector;
   characterized in that:
   the photocathode consists essentially of a binary or pseudobinary III–V material;
   the detector comprises a two-dimensional charge transfer device; and
   the electronic focusing means comprises proximity focusing means.

2. An image sensor device as claimed in claim 1, characterized in that the charge transfer device has a substrate which is sufficiently thin to pass through the substrate photons and photoelectrons to be detected.

3. An image sensor device as claimed in claim 1, characterized in that the electronic focusing means comprises switchable voltage supply means for applying an electric potential between the photocathode and the detector, said switchable voltage supply means being switchable on and off independently of the detector.

4. An image sensor device for day or night operation, said device comprising:
   an evacuated envelope having an inlet window and an outlet support;
   a semitransparent photocathode arranged inside the envelope on the inlet window, said photocathode being capable of transmitting incident photons or converting incident photons into photoelectrons;
   a detector arranged inside the envelope on the outlet support, said detector being capable of converting incident photons received through the photocathode into an electrical image signal or converting incident photoelectrons received from the photocathode into an electrical image signal; and
   electronic means for focusing photoelectrons from the photocathode onto the detector, said electronic means being switchable on and off independently of the detector;
   characterized in that:
   the photocathode consists essentially of a binary or pseudobinary III–V material;
   the detector comprises a two-dimensional charge transfer device; and
   the electronic focusing means comprises proximity focusing means.

5. An image sensor device as claimed in claim 4, characterized in that the charge transfer device has a substrate which is sufficiently thin to pass through the substrate photons and photoelectrons to be detected.

6. An image sensor device as claimed in claim 4, characterized in that the electronic focusing means comprises switchable voltage supply means for applying an electric potential between the photocathode and the detector, said switchable voltage supply means being switchable on and off independently of the detector.

* * * * *